US006629423B1

United States Patent
Hirooka et al.

(10) Patent No.: US 6,629,423 B1
(45) Date of Patent: Oct. 7, 2003

(54) PROCESSOR AND TEMPERATURE CONTROL METHOD THEREFOR

(75) Inventors: Takaaki Hirooka, Nirasaki (JP); Masao Furuya, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/048,068

(22) PCT Filed: Jul. 26, 2000

(86) PCT No.: PCT/JP00/04986

§ 371 (c)(1), (2), (4) Date: Jan. 28, 2002

(87) PCT Pub. No.: WO01/08206

PCT Pub. Date: Feb. 1, 2001

(30) Foreign Application Priority Data

Jul. 27, 1999 (JP) .......................................... 11/212048

(51) Int. Cl.[7] ............................. F25B 41/00; F25B 1/00
(52) U.S. Cl. ....................................... 62/208; 62/228.4
(58) Field of Search ............................... 62/208, 228.4, 62/185, 99, 434; 279/126

(56) References Cited

U.S. PATENT DOCUMENTS

| 3,803,863 | A | * | 4/1974 | Jednacz et al. ............... 62/209 |
| 4,067,203 | A | * | 1/1978 | Behr ............................. 62/208 |
| 4,506,518 | A | * | 3/1985 | Yoshikakw et al. ............ 62/180 |
| 4,633,675 | A | * | 1/1987 | Sato ............................. 62/208 |
| 4,745,767 | A | * | 5/1988 | Ohya et al. .................... 62/211 |
| 5,476,137 | A | * | 12/1995 | Ochiai et al. ................. 165/30 |
| 5,502,970 | A | * | 4/1996 | Rajendran ..................... 62/115 |
| 5,625,526 | A | | 4/1997 | Watanabe et al. ............ 361/234 |
| 5,771,703 | A | * | 6/1998 | Rajendran ..................... 62/204 |
| 5,941,083 | A | * | 8/1999 | Sada et al. ..................... 62/99 |
| 5,943,880 | A | * | 8/1999 | Tateyama ...................... 62/434 |
| 5,974,816 | A | * | 11/1999 | Endo ............................. 62/179 |
| 6,215,682 | B1 | * | 4/2001 | Akamatsu ..................... 363/141 |
| 6,216,475 | B1 | * | 4/2001 | Sada et al. ..................... 62/99 |
| 6,370,897 | B1 | * | 4/2002 | Suenaga et al. ............. 62/283.1 |
| 6,427,462 | B1 | * | 8/2002 | Suenaga et al. ............... 62/185 |
| 2002/0017916 | A1 | * | 2/2002 | Costello et al. ............. 324/760 |
| 2002/0174667 | A1 | * | 11/2002 | Kim et al. ..................... 62/185 |

FOREIGN PATENT DOCUMENTS

| JP | 59-169100 | 9/1984 |
| JP | 4-275420 | 10/1992 |
| JP | 5-243191 | 9/1993 |
| JP | 6-346256 | 12/1994 |
| JP | 9-172001 | 6/1997 |
| JP | 9-172053 | 6/1997 |

OTHER PUBLICATIONS

PCT Notification of Transmittal of Copies of Translation of the International Preliminary Examination Report (PCT/IB/338) issued for PCT/JP00/04986.
International Preliminary Examination Report (PCT/IPEA/409) (translated) issued for PCT/JP00/04986.

* cited by examiner

Primary Examiner—Marc Norman
(74) Attorney, Agent, or Firm—Smith, Gambrell & Russell, LLP

(57) ABSTRACT

A refrigerant circulating passage is provided in a bottom electrode in a processing chamber of an etching system. A refrigerant CW1 is fed from a refrigerant tank to the passage via a refrigerant supply pipe. The refrigerant is cooled in a cooler via a refrigerant pipe and is returned to the refrigerant tank. Temperature sensors provided in the refrigerant supply pipe and refrigerant discharge pipe, detect a feed temperature, an inlet temperature, an outlet temperature and a return temperature, respectively. A target differential value is derived from the heat quantity of a wafer. During processing, the temperature of the refrigerant CW1 is controlled, permitting an actual differential value between the inlet and outlet temperatures follow the target differential value which in turn permits the return temperature to follow a target return temperature which is obtained by subtracting the target differential value from a set temperature of the wafer W.

14 Claims, 2 Drawing Sheets

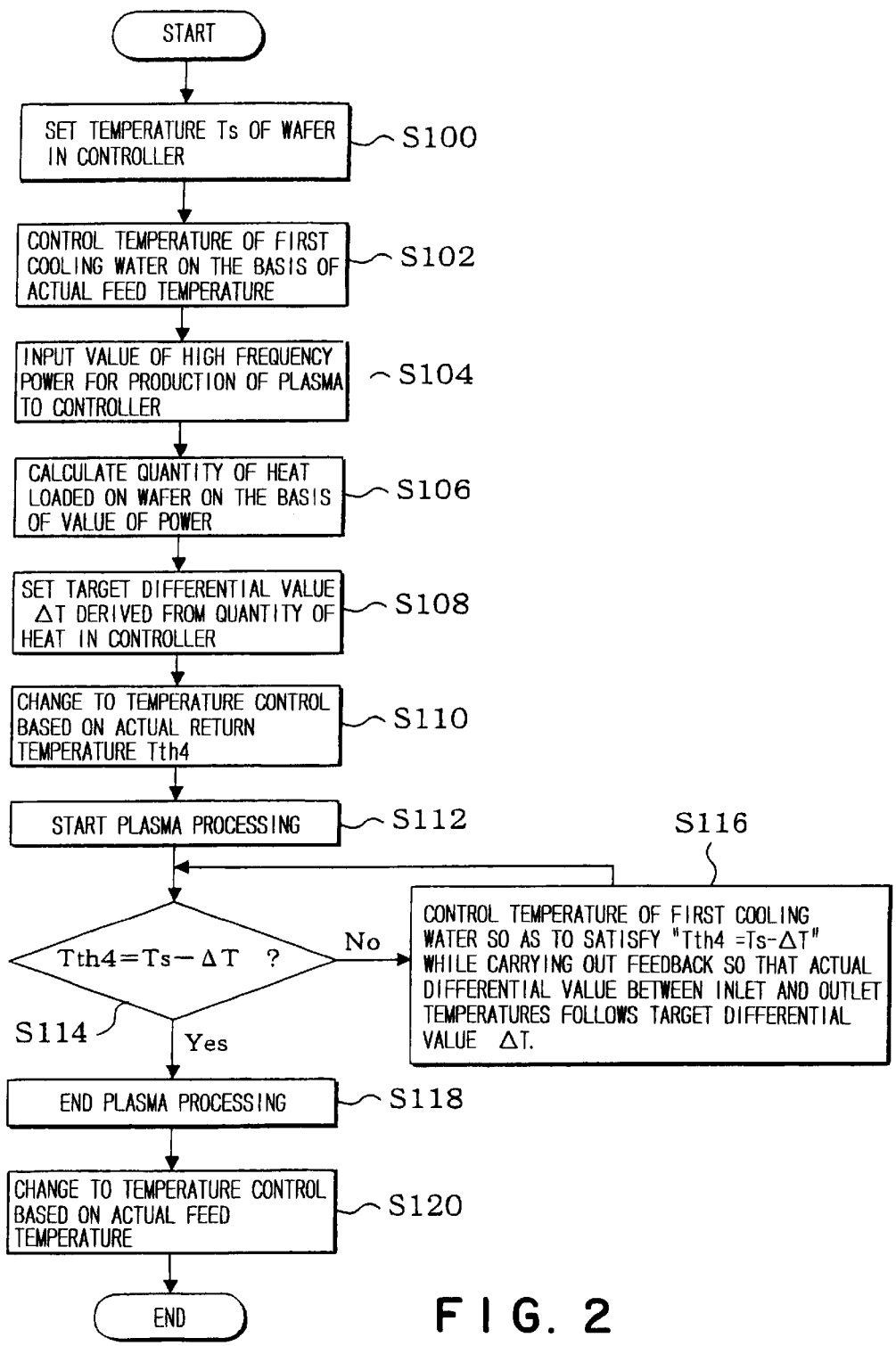
F I G. 2

PROCESSOR AND TEMPERATURE CONTROL METHOD THEREFOR

TECHNICAL FIELD

The present invention relates to a processing system, such as a plasma etching system, and a temperature control method for controlling an object to be processed, in such a processing system.

BACKGROUND ART

In conventional processes for fabricating semiconductor devices and LCD substrates, various processing systems, such as plasma etching systems, are used. For example, in a plasma etching system, a predetermined process gas is activated as plasma in a vacuum processing chamber to etch an object to be processed, such as a semiconductor wafer or glass substrate supported on a supporting table. During the processing, the object to be processed is maintained at a predetermined temperature in order to inhibit the temperature rise of the object due to the plasma, or to enhance the aspect ratio in etching, or to arrange the etched shape.

The temperature control for the object to be processed is generally carried out by a cooling mechanism provided on the supporting table. The cooling mechanism adopts a construction for feeding a refrigerant into a refrigerant circulating passage extending in the supporting table and for absorbing heat by the refrigerant to cool the object to be processed. The refrigerant in a refrigerant tank temperature-controlled by a cooling circuit is fed into the refrigerant circulating passage by a pump, and the refrigerant returned from the refrigerant circulating passage is temperature-controlled by the cooling circuit to be fed into the refrigerant tank. The temperature of the refrigerant in the refrigerant tank or the refrigerant fed from the tank into the refrigerant circulating passage is monitored to carry out a temperature control so that the temperature of the refrigerant is a predetermined temperature.

However, the temperature of the refrigerant is controlled regardless of the heat quantity loaded on the object to be processed, i.e., the heat quantity absorbed by the refrigerant in the refrigerant circulating passage. Therefore, if the heat quantity applied to the object to be processed is increased by the plasma processing, the temperature of the object rises until heat balance is saturated. As a result, there is a problem in that the object to be processed can not be uniformly processed.

DISCLOSURE OF THE INVENTION

It is therefore an object of the present invention to provide a novel and improved processing system and a method for controlling the temperature of the system, the system and method being capable of solving the above described problem and other problems.

According to the present invention, there is provided a method for controlling the temperature of an object to be processed, on a supporting table in a processing system, the system comprising a processing vessel including the supporting table having therein a refrigerant circulating passage, and a temperature control circuit for controlling a heat quantity and/or a flow rate of a refrigerant circulating in the refrigerant circulating passage, wherein inlet and outlet temperatures of the refrigerant in the refrigerant circulating passage are detected, and the heat quantity and/or the flow rate of the refrigerant in the temperature control circuit is controlled on the basis of an actual differential value, which is a difference between the inlet and outlet temperatures, to control the temperature of the object on the supporting table.

According to this method, the actual difference value, which is the differential value between the outlet temperature as the temperature of the refrigerant having absorbed heat in the refrigerant circulating passage, and the inlet temperature as the temperature of the refrigerant before absorbing heat, is in proportion to the heat quantity per unit time, the heat quantity being absorbed by the refrigerant from the object to be processed (via the supporting table). Therefore, by controlling the heat quantity and/or the flow rate of the refrigerant in the temperature control circuit on the basis of its actual differential value, the temperature control can be carried out so as to maintain the object at a constant temperature, in accordance with the variation in heat quantity applied to the object during the processing. Thus, the processing system can uniformly process the object by maintaining the constant temperature of the object.

In this method, preferably, a target differential value, which is a theoretical difference between the inlet and outlet temperature of the refrigerant in the refrigerant circulating passage, is previously determined in accordance with a process in the processing system, and the heat quantity and/or the flow rate of the refrigerant in the temperature control circuit is controlled so that the actual differential value follows the target differential value.

According to such a construction, on the basis of the target differential value, which is the theoretical difference between the inlet and outlet temperature according to the processing, the temperature can be controlled so that the actual differential value is substantially equal to the target differential value. Therefore, it is possible to precisely control the temperature of the object.

In this case, more preferably, a relationship between the target differential value and a target return temperature of the refrigerant returning to the temperature control circuit is previously determined in accordance with the process in the processing system, and the heat quantity and/or the flow rate of the refrigerant is controlled so that an actual return temperature of the refrigerant returning to the temperature control circuit follows the target return temperature.

According to such a construction, if the relationship between the target differential value and the target return temperature is set so that the value obtained by subtracting the target differential value from the set temperature of the object is equal to the target return temperature, the temperature of the refrigerant can be surely controlled according to the variation in heat quantity during the processing, by controlling the heat quantity and/or the flow rate of the refrigerant so that the actual return temperature follows the target return temperature.

In this case, if the heat quantity and/or the flow rate is controlled while carrying out the feedback so that the actual differential value follows the target differential value, it is possible to more precisely control the temperature of the object.

In place of the target return temperature, the target feed temperature may be used. That is, a relationship between the target differential value and a target feed temperature of the refrigerant being fed from the temperature control circuit may be previously determined in accordance with the process in the processing system, and the heat quantity and/or the flow rate of the refrigerant may be controlled so that an actual feed temperature of the refrigerant being fed from the temperature control circuit follows the target feed temperature.

According to another aspect of the present invention, there is provided a processing system comprising: a processing vessel for processing therein an object to be processed; a supporting table, provided in the processing vessel, for supporting thereon the object; a refrigerant circulating passage formed in the supporting table; and a temperature control circuit for controlling a heat quantity and/or a flow rate of a refrigerant circulating in the refrigerant circulating passage, the processing system further comprising: an inlet temperature detector for detecting an inlet temperature of the refrigerant in the refrigerant circulating passage; an outlet temperature detector for detecting an outlet temperature of the refrigerant in the refrigerant circulating passage; and a controller for controlling the heat quantity and/or the flow rate by the temperature control circuit on the basis of an actual differential value which is a difference between the inlet and outlet temperatures detected by the temperature detectors.

According to this processing system, the inlet and outlet temperatures, which are the temperatures of the refrigerant before and after absorbing heat in the refrigerant circulating passage, are detected by the inlet temperature detector and the outlet temperature detector. The actual differential value, which is the differential value between the outlet and inlet temperatures, is in proportion to the heat quantity per unit time, the heat quantity being absorbed by the refrigerant from the object via the supporting table. Therefore, by controlling the heat quantity and/or the flow rate of the refrigerant in the temperature control circuit by means of the controller on the basis of the actual differential value, the temperature control can be carried out so as to maintain the object at a constant temperature, in accordance with the variation in heat quantity applied to the object during the processing. Thus, the processing system can uniformly process the object by maintaining the constant temperature of the object.

In this system, preferably, further comprise a return temperature detector for detecting a return temperature of the refrigerant returning to the temperature control circuit, the controller controlling the return temperature on the basis of the actual differential value.

In place of the target return temperature, the target feed temperature may be used. That is, the processing system may further comprise a feed temperature detector for detecting a feed temperature of the refrigerant being fed from the temperature control circuit, the controller controlling the feed temperature on the basis of the actual differential value.

In above described systems, preferably, the temperature control circuit controls the heat quantity and/or the flow rate of the refrigerant via an inverter-controlled electrical driving unit.

Thus, the operation of the electrical driving unit can be finely controlled to stably control the heat quantity and/or the flow rate of the refrigerant. It is also possible to prevent a rush current from being generated by the on/off of the electrical driving unit and so forth, so that it is possible to reduce electric power consumption.

BRIEF DESCRIPTION OF THE DRAWINGS

FIG. 2 is a flow chart for explaining the temperature control of a refrigerant in the etching system shown in FIG. 1.

BEST MODE FOR CARRYING OUT THE INVENTION

Figure 1:
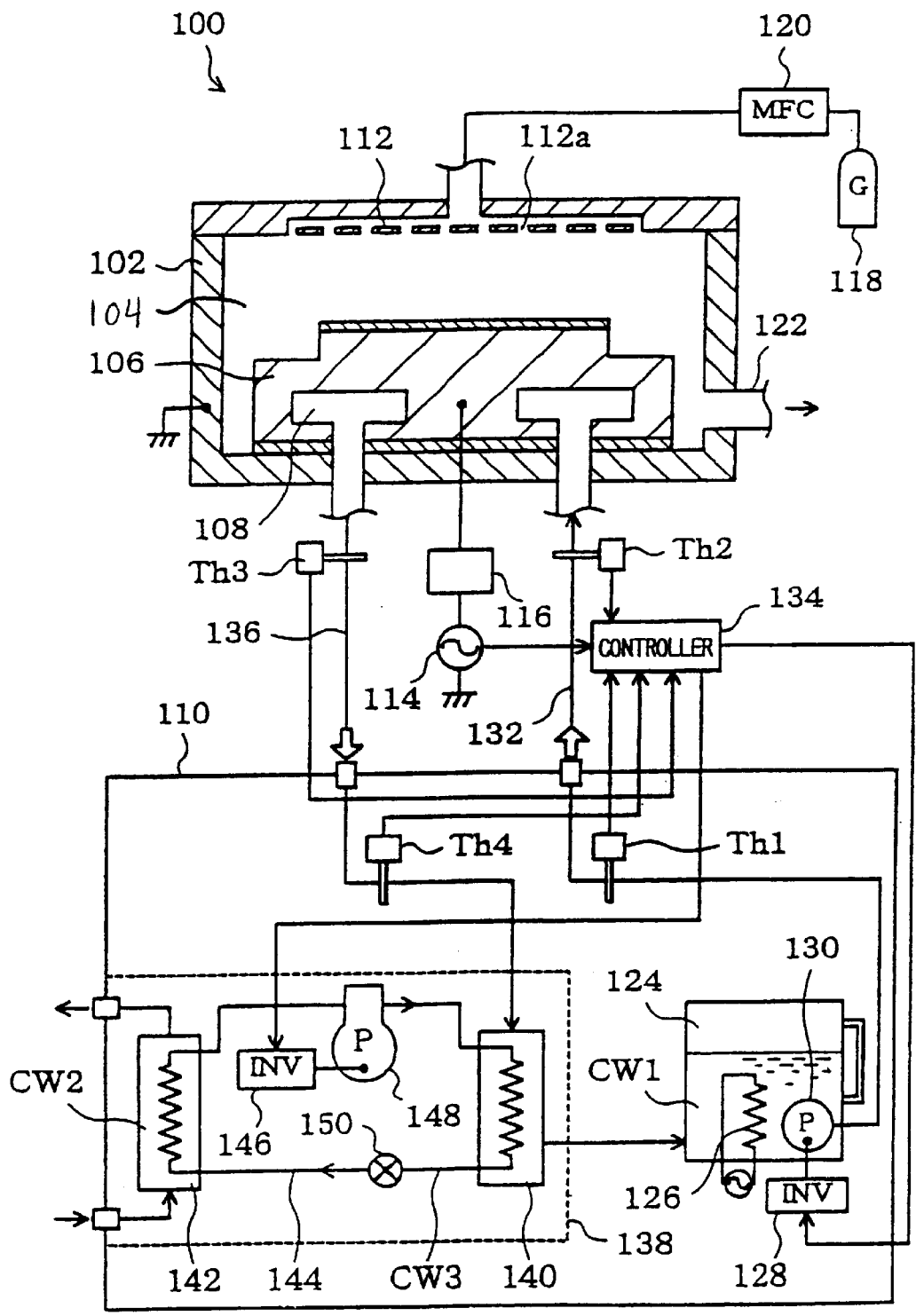
FIG. 1 is a schematic diagram showing an example of an etching system serving as a processing system according to the present invention.

Referring to the accompanying drawings, a preferred embodiment of a processing system and its temperature control method according to the present invention, the system and method being applied to a plasma etching system and its temperature control system, will be described below in detail.

(1) General Construction of Etching System

First, the construction of an etching system 100 will be generally described below. As shown in FIG. 1, in a processing chamber 104 formed in an airtight processing vessel 102, there is arranged a bottom electrode 106 serving as a supporting table capable of supporting thereon an object to be processed, e.g., a semiconductor wafer (this semiconductor wafer will be hereinafter referred to as a "wafer") W. In the bottom electrode 106, a refrigerant circulating passage 108 is formed for cooling the wafer W via the bottom electrode 106 to maintain the wafer W at a predetermined temperature.

To the refrigerant circulating passage 108, a cooling circuit 110 serving as a temperature control circuit forming the central core of the present invention, is connected. This cooling circuit 110 is designed to supply a first cooling water CW1, serving as a refrigerant temperature-controlled as will be described later, into the refrigerant circulating passage 108, and to recover the first cooling water CW1 having circulated in the refrigerant circulating passage 108 to control the temperature of the recovered first cooling water CW1 again. The construction of the cooling circuit 110 and the temperature control of the first cooling water CW1 will be described later in detail.

In the processing chamber 104, a top electrode 112 is arranged in face-to-face relationship with the supporting face of the bottom electrode 106. A process gas supplied from a process gas source (G) 118 is fed into the processing chamber 104 via a mass flow controlling valve (MFC) 120 and a large number of gas discharge holes 112a formed in the top electrode 112. With this construction, if a high frequency power outputted from a high frequency power supply 114 is applied to the bottom electrode 106 via a matching unit 116, the process gas fed into the processing chamber 104 is activated as plasma to etch the wafer W maintained at a predetermined temperature on the bottom electrode 106. The gas in the processing chamber 104 is exhausted from an exhaust system 122.

(2) Construction of Cooling Mechanism

The cooling circuit (temperature control circuit) 110 forming the central core of the present invention will be described below in detail.

In the refrigerant tank 124 constituting the cooling circuit 110, the first cooling water CW1, whose temperature s controlled as will be described later, is stored. In the refrigerant tank 124, a heater 126 for heating the first cooling water CW1 is provided. The first cooling water CW1 in the refrigerant tank 124 is pressurized by a first circulating pump 130 to be fed to the refrigerant circulating passage 108 in the bottom electrode 106 via a refrigerant supply passage 132.

The cycle of a motor (electrical driving unit) for driving the first circulating pump 130 can be suitably adjusted by controlling the frequency of the power supply by means of a first inverter circuit 128, so that a constant flow rate of the first cooling water CW1 according to set conditions can be circulated between the refrigerant circulating passage 108 and the cooling circuit 110. As a result, the temperature control of the first cooling water CW1, as will be described later, can be easily and precisely carried out. The discharge rate of the first circulating pump 130 is suitably adjusted by controlling the first inverter circuit 128 by means of a controller 134.

The first cooling water CW1 having circulated in the refrigerant circulating passage 108 is returned to the cooling circuit 110 via a refrigerant discharge pipe 136 to be temperature-controlled to a predetermined temperature by means of a cooler 138 to be stored in the refrigerant tank 124 again. The cooler 138 comprises a first heat exchanger 140, a second heat exchanger 142 and a heat exchanging passage 144. The first heat exchanger 140 is provided in the refrigerant discharge pipe 136, and is designed to cool the first cooling water CW1. The second heat exchanger 142 is designed to circulate a second cooling water CW2 having a lower temperature than that of the first cooling water CW1. The heat exchanging passage 144 is designed to circulate a third cooling water CW3 for deliver heat between the first and second heat exchangers 140 and 142. In the heat exchanging passage 144, a second circulating pump 148 driven by a motor (electrical driving unit) controlled by a second inverter circuit 146 and a shut-off valve 150 are provided.

Therefore, the second inverter circuit 146 adjusts the discharge rate of the second circulating pump 148 on the basis of a command from the controller 134, and a predetermined flow rate of the third cooling water CW3 cooled in the second heat exchanger 142 is circulated in the heat exchanging passage 144. Thus, heat of the first cooling water CW1 is absorbed by the third cooling water CW3 passing through the first heat exchanger 140, so that the first cooling water CW1 is temperature-controlled at a predetermined temperature. That is, by adjusting the discharge of the second circulating pump 148 by the command from the controller 134, the temperature of the first cooling water CW1 can be suitably changed. If the flow rate of the third cooling water CW3 is increased, the temperature of the first cooling water CW1 drops, and if the flow rate is decreased, the temperature of the first cooling water CW1 rises.

According to this construction, the first cooling water CW1 can be temperature-controlled without changing the flow rate of the first cooling water CW1. Therefore, since the flow rate of the first cooling water CW1 can be constant, a calculation used for the temperature control of the first cooling water CW1, as will be described later, can be precisely carried out. Since the cycle of the second circulating pump 148 can be inverter-controlled, the response of the temperature control of the first cooling water CW1 can be improved by rapidly controlling the flow rate of the third cooling water CW3, and electric power consumption can be reduced by efficiently regulating the flow rate of the third cooling water CW3.

In the refrigerant supply pipe 132, a first temperature sensor Th1 serving as a feed temperature detector, and a second temperature sensor Th2 serving as an inlet detector are provided. In the refrigerant discharge pipe 136, a third temperature sensor Th3 serving as an outlet temperature detector, and a fourth temperature sensor Th4 serving as a return temperature detector are provided.

The first temperature sensor Th1 is designed to detect an actual feed temperature of the first cooling water CW1 immediately after being fed from the refrigerant tank 124, and the fourth temperature sensor Th4 is designed to detect an actual return temperature of the first cooling water CW1 immediately before being returned into the first heat exchanger 140. The second temperature sensor Th2 is designed to detect an actual inlet temperature of the first cooling water CW1 immediately before being supplied into the refrigerant circulating passage 108, and the third temperature sensor Th3 is designed to detect an actual outlet temperature of the first cooling water CW1 immediately after being discharged from the refrigerant circulating passage 108. The respective temperature information detected by the first through fourth temperature sensors Th1 through Th4 is transmitted to the controller 134 to be used for carrying out the temperature control of the first cooling water CW1 as will be described later.

(3) Temperature Control of Wafer W

Referring to the flow chart of FIG. 2, the temperature control of the wafer W will be described below. First, before the processing starts, the temperature of the wafer W during the processing is set at a temperature Ts, e.g., 100° C., in the controller 134 (step S100). Thereafter, the controller 134 controls the cooler 138 to control the temperature of the first cooling water CW1 so that the actual feed temperature detected by the first temperature sensor Th1 is the set temperature Ts, 100° C. (step S102). Subsequently, before the plasma processing up to step S108 as will be described later, the temperature control of the first cooling water CW1 is carried out on the basis of the temperature detected by the first temperature sensor Th1.

Then, the value of a high frequency power to be applied to the bottom electrode 106 during the processing is set in the controller 134 (step S104). The controller 134 calculates the heat quantity Q per unit time applied to the wafer W during the processing (this value of heat Q will be hereinafter simply referred to as the "heat quantity Q") from a previously-obtained linear approximate expression for calculation of the heat quantity, on the basis of the above described value of the power (step S106). Since the heat quantity Q varies every plasma-source of the processing system, the above described linear approximate expression is derived from the previously experimentally obtained relationship between the value of power and the heat quantity.

The controller 134 calculates a target differential value ΔT, which is a theoretical difference between the inlet temperature and outlet temperature of the refrigerant in the refrigerant circulating passage 108, on the basis of the calculated heat quantity Q from the following expression (A), and sets the calculated target differential value ΔT (step S108).

$$\Delta T = Q/(G \cdot Cp \cdot \rho) \tag{A}$$

This target differential value ΔT is used for controlling the temperature of the first cooling water CW1 during the plasma processing as will be described later. In the expression (A), "G" denotes the flow rate of the first cooling water CW1, "Cp" denotes the specific heat of the first cooling water CW1, and "ρ" denoting the density of the first cooling water CW1. Since the flow rate G is set to be constant as described above and since the specific heat Cp and the density ρ are determined by the component of the first cooling water CW1, the target differential value ΔT can be easily calculated from the heat quantity Q, i.e., from the value of the high frequency power applied to the bottom electrode 106. It is herein assumed that the target differential value ΔT=−3° C.

After the target differential value ΔT is set, the temperature control of the first cooling water CW1 is changed from the control based on the actual feed temperature Tth1 detected by the first temperature sensor Th1, to the control based on the actual return temperature Tth4 detected by the fourth temperature sensor Th4 (step S110). In this temperature control, the cooler 138 is controlled to control the temperature of the first cooling water CW1 so that the actual return temperature Tth4 detected by the fourth temperature sensor Th4 is a target return temperature Tth4'=100-(-3)=103° C. calculated from an expression "Tth4'=Ts-ΔT", when the set temperature Ts of the wafer W is 100° C. and the target differential value ΔT is -3° C. as described above.

Thereafter, a high frequency of the above described value of power is applied to the bottom electrode 106 so as to produce plasma to etch the wafer (step S112). According to this construction, the temperature control is carried out on the basis of the actual feed temperature Tth1 before the plasma processing wherein the wafer W is not heated, and the temperature control is changed, immediately before heat is loaded on the wafer W, so as to be carried out on the basis of the actual return temperature Tth4. Therefore, before the plasma processing, it is possible to prevent the first cooling water CW1 having excessively cooled from being fed in to the refrigerant circulating passage 108 to excessively cool the wafer W (or the bottom electrode 106). During the plasma processing from step S112 to step S118, the temperature control of the first cooling water CW1 is carried out on the basis of the actual return temperature Tth4 detected by the fourth temperature sensor Th4.

During the plasma processing, the actual return temperature Tth4 is always detected by the fourth temperature sensor Th4, and the controller 134 determines whether the actual return temperature Tth4 is equal to the above described target return temperature Tth4', i.e., 103° C. (step S114). If both temperatures are equal to each other, the processing is carried out while maintaining the temperature of the first cooling water CW1, and thereafter, the processing is completed (step 118).

On the other hand, if the actual return temperature Tth4 is higher or lower than the target return temperature Tth4', the cooling rate of the cooler 138 is adjusted by a command from the controller 134 to control the temperature of the first cooling water CW1 so that the actual return temperature Tth4 is 103° C. equal to the target return temperature Tth4'. However, since the first cooling water CW1 cooled by the cooler 138 is fed out after being temporarily stored in the refrigerant tank 124 and circulates in the extending refrigerant supply pipe 132 and refrigerant discharge pipe 136, there is a time lag until the temperature is detected by the fourth temperature sensor Th4. Therefore, if the temperature control is simply carried out on the basis of the actual return temperature Tth4, the temperature of the first cooling water CW1 is too low.

Accordingly, the inlet temperature and outlet temperature of the refrigerant circulating passage 108 are detected by the second and third temperature sensors Th2 and Th3, and the controller 134 calculate an actual differential value by subtracting the inlet temperature from the outlet temperature. Then, while a feedback control is carried out so that the actual differential value is equal to the above described target differential value ΔT, the temperature control based on the actual return temperature Tth4 is carried out (step S116). With this construction, since it is possible to prevent the temperature of the first cooling water CW1 from excessively dropping, it is possible to maintain the wafer W at the set temperature to carry out a uniform processing. The above described steps S114 through S116 are always carried out until the etching is completed.

After the etching is completed, the temperature control based on the actual return temperature Tth4 is changed to the above described temperature control based on the actual feed temperature Tth1 again (step S120). When a plurality of wafers W are continuously processed, the temperature control is changed to the control based on the actual feed temperature Tth1 after the processing for the final wafer W is completed.

This preferred embodiment is constructed as described above. In this preferred embodiment, the temperature control of the first cooling water CW1 is carried out on the basis of the actual return temperature Tth4 which is a temperature of the first cooling water CW1 having absorbed heat. Therefore, even if the heat quantity loaded on the wafer W varies during the processing, it is possible to cool the first cooling water CW1 while following the variation in heat quantity, so that it is possible to precisely control the temperature of the wafer W. Since the above described temperature control is carried out while carrying out the feedback control based on the actual differential value and target differential value ΔT, it is possible to substantially prevent the variation in temperature of the wafer W.

While the preferred embodiment of the present invention has been described referring to the accompanying drawings, the present invention should not be limited to such a construction. The technical scope of the present invention should be understood to include all changed and modified embodiments which can be embodied, by persons with ordinary skill in the art, without departing from the category of the technical idea as set forth in the appended claims.

While the "control of heat quantity" of the first cooling water has been carried out in the above described preferred embodiment, the present invention should not be limited thereto. For example, the present invention may be applied to the "control of flow rate" of the refrigerant circulating in the refrigerant circulating passage. In such a case, the flow rate of the refrigerant, which is circulating in the refrigerant circulating passage and has a predetermined constant temperature, may be adjusted on the basis of the actual return temperature Tth4.

While the temperature control of the first cooling water has been carried out on the basis of the actual return temperature Tth4 during the processing in the above described preferred embodiment, the present invention should not be limited thereto. For example, the present invention may be applied in the case when the refrigerant is controlled on the basis of the actual feed temperature Tth1 in place of the actual return temperature Tth4 during the processing.

While the temperature control of the first cooling water has been carried out on the basis of the temperature of the wafer in the above described preferred embodiment, the present invention should not be limited thereto. For example, the present invention may be applied in the case when the temperature of the refrigerant is controlled on the basis of the temperature of the supporting table.

What is claimed is:

1. A method for controlling the temperature of an object to be processed, on a supporting table in a processing system, said system comprising a processing vessel including said supporting table having therein a refrigerant circulating passage, and a temperature control circuit for controlling a heat quantity and/or a flow rate of a refrigerant circulating in said refrigerant circulating passage, wherein a target differential value is previously determined in accordance with a process in said processing system, said target differential value being a theoretical difference between inlet and outlet temperatures of the refrigerant in said refrigerant circulating passage, said inlet and outlet temperatures of the refrigerant in said refrigerant circulating passage are detected to determine an actual differential value that is a difference between said inlet and outlet temperatures, and the heat quantity and/or the flow rate of the refrigerant in said temperature control circuit is controlled so that said actual differential value follows said target differential value to control the temperature of said object on said supporting table.

2. The method as set forth in claim 1, wherein said target differential value is determined on the basis of a heat quantity per unit time applied to the object to be processed in accordance with the process in said processing system.

3. The method as set forth in claim 2, wherein said inlet and outlet temperatures are actual inlet and outlet temperatures of the refrigerant in said refrigerant circulating passage as detected by temperature detectors.

4. A method for controlling the temperature of an object to be processed, on a supporting table in a processing system, said system comprising a processing vessel including said supporting table having therein a refrigerant circulating passage, and a temperature control circuit for controlling a heat quantity and/or a flow rate of a refrigerant circulating in said refrigerant circulating passage, wherein a target differential value, and a relationship between said target differential value and a target return temperature of the refrigerant returning to said temperature control circuit are previously determined in accordance with a process in said processing system, said target differential value being a theoretical difference between inlet and outlet temperatures of the refrigerant in said refrigerant circulating passage, said inlet and outlet temperatures of the refrigerant in the refrigerant circulating passage are detected to determine an actual differential value that is a difference between said inlet and outlet temperatures, and the heat quantity and/or the flow rate of said refrigerant in said temperature control circuit is controlled so that said actual differential value follows said target differential value and that an actual return temperature of the refrigerant returning to said temperature control circuit follows said target return temperature to control the temperature of said object on said supporting table.

5. The method as set forth in claim 4, wherein said target differential value is determined on the basis of a heat quantity per unit time applied to the object to be processed in accordance with the process in said processing system.

6. The method as set forth in claim 5 wherein said inlet and outlet temperatures are actual inlet and outlet temperatures of the refrigerant in said refrigerant circulating passage as detected by temperature detectors.

7. A method for controlling the temperature of an object to be processed, on a supporting table in a processing system, said system comprising a processing vessel including said supporting table having therein a refrigerant circulating passage, and a temperature control circuit for controlling a heat quantity and/or a flow rate of a refrigerant circulating in said refrigerant circulating passage, wherein a target differential value, and a relationship between said target differential value and a target feed temperature of the refrigerant being fed from said temperature control circuit are previously determined in accordance with a process in said processing system, said target differential value being a theoretical difference between inlet and outlet temperatures of the refrigerant in said refrigerant circulating passage, said inlet and outlet temperatures of the refrigerant in said refrigerant circulating passage are detected to determine an actual differential value that is a difference between said inlet and outlet temperatures, and the heat quantity and/or the flow rate of said refrigerant in said temperature control circuit is controlled so that said actual differential value follows said target differential value and that an actual feed temperature of the refrigerant being fed from said temperature control circuit follows said target feed temperature to control the temperature of said object on said supporting table.

8. The method as set forth in claim 7, wherein said target differential value is determined on the basis of a heat quantity per unit time applied to the object to be processed in accordance with the process in said processing system.

9. The method as set forth in claim 8 wherein said inlet and outlet temperatures are actual inlet and outlet temperatures of the refrigerant in said refrigerant circulating passage as detected by temperature detectors.

10. A method for controlling the temperature of an object to be processed, on a supporting table in a processing system, said system comprising a processing vessel including said supporting table having therein a refrigerant circulating passage, an electrode through which a high frequency power is applied into said processing vessel, and a temperature control circuit for controlling a heat quantity and/or a flow rate of a refrigerant circulating in said refrigerant circulating passage, wherein a heat quantity per unit time applied to the object on said supporting table is calculated on the basis of a value of said high frequency power applied into said processing vessel, (a) before processing the object, the heat quantity and/or the flow rate of the refrigerant is controlled so that an actual feed temperature of the refrigerant being fed from said temperature control circuit is equal to a set value of a processing temperature of the object, and (b) during the processing of the object, the heat quantity and/or the flow rate of the refrigerant is controlled so that an actual return temperature of the refrigerant returning to said temperature control circuit is equal to a target return temperature determined on the basis of said heat quantity per unit time.

11. A processing system comprising:

a processing vessel for processing therein an object to be processed;

a supporting table, provided in said processing vessel, for supporting thereon said object;

a refrigerant circulating passage formed in said supporting table; and a temperature control circuit for controlling a heat quantity and/or a flow rate of a refrigerant circulating in said refrigerant circulating passage, said processing system further comprising:

an inlet temperature detector for detecting an inlet temperature of the refrigerant in said refrigerant circulating passage;

an outlet temperature detector for detecting an outlet temperature of the refrigerant in said refrigerant circulating passage;

a return temperature detector for detecting a return temperature of the refrigerant returning to said temperature control circuit; and a controller for controlling said return temperature on the basis of an actual differential value by controlling the heat quantity and/or the flow rate by said temperature control circuit, said actual differential value being a difference between said inlet and outlet temperatures detected by said temperature detectors.

12. The processing system as set forth in claim 11, wherein said temperature control circuit controls the heat quantity and/or the flow rate of the refrigerant via an inverter-controlled electrical driving unit.

13. A processing system comprising:

a processing vessel for processing therein an object to be processed;

a supporting table, provided in said processing vessel, for supporting thereon said object;

a refrigerant circulating passage formed in said supporting table; and a temperature control circuit for controlling a heat quantity and/or a flow rate of a refrigerant circulating in said refrigerant circulating passage, said processing system further comprising:

an inlet temperature detector for detecting an inlet temperature of the refrigerant in said refrigerant circulating passage;

an outlet temperature detector for detecting an outlet temperature of the refrigerant in said refrigerant circulating passage;

a feed temperature detector for detecting a feed temperature of the refrigerant being fed from said temperature control circuit; and a controller for controlling said feed temperature on the basis of an actual differential value by controlling the heat quantity and/or the flow rate by said temperature control circuit, said actual differential value being a difference between said inlet and outlet temperatures detected by said temperature detectors.

14. The processing system as set forth in claim 13, wherein said temperature control circuit controls the heat quantity and/or the flow rate of the refrigerant via an inverter-controlled electrical driving unit.

* * * * *